(12) United States Patent
Yun et al.

(10) Patent No.: US 10,669,627 B2
(45) Date of Patent: Jun. 2, 2020

(54) MULTI-LAYER DEPOSITION SYSTEM AND PROCESS

(71) Applicant: HZO, Inc., Draper, UT (US)

(72) Inventors: Yang Yun, Draper, UT (US); Max Sorenson, Herriman, UT (US); Chien-Lan Hsueh, Draper, UT (US); Tining Su, Draper, UT (US); Jim Dempster, Reno, NV (US); Alex Anderson, Draper, UT (US); Layton Baker, Draper, UT (US)

(73) Assignee: HzO, Inc., Morrisville, NC (US)

( * ) Notice: Subject to any disclaimer, the term of this patent is extended or adjusted under 35 U.S.C. 154(b) by 0 days.

(21) Appl. No.: 15/691,593

(22) Filed: Aug. 30, 2017

(65) Prior Publication Data

US 2018/0237909 A1 Aug. 23, 2018

Related U.S. Application Data

(60) Provisional application No. 62/381,440, filed on Aug. 30, 2016.

(51) Int. Cl.
| | |
|---|---|
| *C23C 16/455* | (2006.01) |
| *H01L 21/67* | (2006.01) |
| *H01L 21/677* | (2006.01) |
| *C23C 16/44* | (2006.01) |
| *C23C 16/00* | (2006.01) |

(Continued)

(52) U.S. Cl.
CPC ........ *C23C 16/45525* (2013.01); *C23C 16/00* (2013.01); *C23C 16/44* (2013.01); *C23C 16/455* (2013.01); *C23C 16/45544* (2013.01); *C23C 16/52* (2013.01); *H01L 21/6776* (2013.01); *H01L 21/67161* (2013.01); *H01L 21/67173* (2013.01); *H01L 21/67207* (2013.01); *H01L 21/022* (2013.01)

(58) Field of Classification Search
CPC .......... C23C 16/45544; C23C 16/0272; C23C 16/45525; C23C 16/54; H01L 21/67161; H01L 21/67155; H01L 21/6719; H01L 21/67173
See application file for complete search history.

(56) References Cited

U.S. PATENT DOCUMENTS

| | | | | |
|---|---|---|---|---|
| 6,315,879 | B1 * | 11/2001 | Washburn | ............ C23C 14/352 118/719 |
| 9,385,318 | B1 | 7/2016 | Henri | |
| 2002/0003403 | A1 | 1/2002 | Ghosh et al. | |

(Continued)

OTHER PUBLICATIONS

Copenheaver "International Search Report for PCT/US2017/049470" dated Nov. 20, 2017, 2 pages.

(Continued)

*Primary Examiner* — Elizabeth A Burkhart
(74) *Attorney, Agent, or Firm* — Intellectual Strategies

(57) ABSTRACT

A modular multilayer deposition system includes a plurality of modular deposition chambers, including at least one parylene deposition chamber and at least one ALD deposition chamber. The parylene deposition chamber is connected in series with the ALD deposition chamber. Substrates are automatically moved from within the parylene deposition chamber to within the ALD deposition chamber or from within the ALD deposition chamber to the parylene deposition chamber.

12 Claims, 9 Drawing Sheets

(51) Int. Cl.
*C23C 16/52* (2006.01)
*H01L 21/02* (2006.01)

(56) References Cited

U.S. PATENT DOCUMENTS

| | | | |
|---|---|---|---|
| 2013/0286567 A1* | 10/2013 | Sorenson | C23C 16/02 361/679.01 |
| 2014/0268526 A1* | 9/2014 | Stevens | H05K 3/284 361/679.01 |
| 2017/0159178 A1 | 6/2017 | Baker et al. | |

OTHER PUBLICATIONS

Copenheaver "Written Opinion of the International Searching Authority for PCT/US2017/049470" dated Nov. 20, 2017, 6 pages.

* cited by examiner

MULTI-LAYER DEPOSITION SYSTEM AND PROCESS

RELATED APPLICATIONS

This application claims priority to U.S. Provisional Patent Application No. 62/381,440, filed Aug. 30, 2016, which is incorporated herein by reference in its entirety.

BACKGROUND

This disclosure relates generally to multi-layer deposition of protective coatings on substrates of electronic devices. More specifically, this disclosure relates to a modular processing system used for the deposition of protective coatings on substrates of electronic devices.

SUMMARY

The subject matter of the present application has been developed in response to the present state of the art, and in particular, in response to the problems and disadvantages associated with the deposition of protective coatings that have not yet been fully solved by currently available techniques. Accordingly, the subject matter of the present application has been developed to provide embodiments of a system, an apparatus, and a method that overcome at least some of the shortcomings of prior art techniques.

Disclosed herein is a modular multilayer deposition system. The modular multilayer deposition system includes a plurality of modular deposition chambers, including at least one parylene deposition chamber and at least one ALD deposition chamber. The parylene deposition chamber is connected in series with the ALD deposition chamber. Substrates are automatically moved from within the parylene deposition chamber to within the ALD deposition chamber or from within the ALD deposition chamber to the parylene deposition chamber. The preceding subject matter of this paragraph characterizes example 1 of the present disclosure.

The modular multilayer deposition system further includes a plurality of parylene deposition chambers and a plurality of ALD deposition chambers connected in series. The preceding subject matter of this paragraph characterizes example 2 of the present disclosure, wherein example 2 also includes the subject matter according to example 1, above.

The modular multilayer deposition system includes a first parylene deposition chamber connected in series to a group of four ALD deposition chambers consecutively connected in series. The preceding subject matter of this paragraph characterizes example 3 of the present disclosure, wherein example 3 also includes the subject matter according to any one of examples 1-2, above.

The modular multilayer deposition system includes a second parylene deposition chamber connected in series to a second group of four ALD deposition chambers The preceding subject matter of this paragraph characterizes example 4 of the present disclosure, wherein example 4 also includes the subject matter according to any one of examples 1-3, above.

The parylene deposition chamber is configured to deposit one of parylene C, parylene F, parylene N, parylene A, or parylene D onto the substrates within the parylene deposition chamber. The preceding subject matter of this paragraph characterizes example 5 of the present disclosure, wherein example 5 also includes the subject matter according to any one of examples 1-4, above.

The modular multilayer deposition system includes a gate valve between the at least one parylene deposition chamber and the at least one ALD deposition chamber. The gate valve movably separates the at least one parylene deposition chamber and the at least one ALD deposition chamber. The gate valve seals the at least one parylene deposition chamber and also the at least one ALD deposition chamber. The preceding subject matter of this paragraph characterizes example 6 of the present disclosure, wherein example 6 also includes the subject matter according to any one of examples 1-5, above.

The modular multilayer deposition system includes a processor and a controller. The controller configured to control the at least one parylene deposition chamber and at least one ALD deposition chamber. The preceding subject matter of this paragraph characterizes example 7 of the present disclosure, wherein example 7 also includes the subject matter according to any one of examples 1-6, above.

The controller is configured to control movement of the substrates between the at least one parylene deposition chamber and at least one ALD deposition chamber. The preceding subject matter of this paragraph characterizes example 8 of the present disclosure, wherein example 8 also includes the subject matter according to any one of examples 1-7, above.

The modular multilayer deposition system includes a pyrolizer and a plurality of parylene deposition chambers. The plurality of parylene deposition chambers are connected in parallel to the pyrolizer. The modular multilayer deposition system includes a conduit between the pyrolizer and the plurality of parylene deposition chambers. The preceding subject matter of this paragraph characterizes example 9 of the present disclosure, wherein example 9 also includes the subject matter according to any one of examples 1-8, above.

Disclosed herein is a method for depositing multiple layers onto a substrate. The method includes applying a plurality of sub-layers onto a substrate, the plurality of sub-layers including a first and second ALD sub-layer applied in at least one ALD modular deposition chamber and a first and second parylene sub-layer applied in at least one parylene modular deposition chamber. One of the first or second ALD sub-layer is deposited between the first and second parylene sub-layer. One of the first or second parylene sub-layer is deposited between the first and second ALD sub-layer. The preceding subject matter of this paragraph characterizes example 10 of the present disclosure.

The method for depositing multiple layers onto a substrate includes applying a parylene sub-layer to a substrate within a parylene deposition chamber, applying at least one ALD sub-layer to the substrate over the parylene sub-layer within an ALD deposition chamber, applying a second parylene sub-layer to the substrate over the at least one ALD sub-layer within a second parylene deposition chamber, and applying a second ALD layer to the substrate over the second parylene sub-layer within a second ALD deposition chamber. The preceding subject matter of this paragraph characterizes example 11 of the present disclosure, wherein example 11 also includes the subject matter according to example 12, above.

The method for depositing multiple layers onto a substrate includes applying at least one ALD sub-layer to the substrate within an ALD deposition chamber, applying a parylene sub-layer to the substrate over the at least one ALD sub-layer within a first parylene deposition chamber, applying a second ALD layer to the substrate over the first parylene sub-layer within a second ALD deposition chamber, and applying a second parylene sub-layer to the substrate over the second ALD sub-layer within a second parylene deposition chamber. The preceding subject matter of this paragraph characterizes example 12 of the present disclosure, wherein example 12 also includes the subject matter according to example 10, above The parylene sub-layer includes one of parylene C, parylene F, parylene N, parylene A, or parylene D. The preceding subject matter of this paragraph characterizes example 13 of the present disclosure, wherein example 13 also includes the subject matter according to any one of examples 10-12, above.

The method includes changing the order of modular deposition chambers The preceding subject matter of this paragraph characterizes example 14 of the present disclosure, wherein example 14 also includes the subject matter according to any one of examples 10-13, above.

The at least one ALD sub-layer includes one of an organic material, an inorganic material, and a composite material. The preceding subject matter of this paragraph characterizes example 15 of the present disclosure, wherein example 15 also includes the subject matter according to any one of examples 10-14, above.

The second ALD sub-layer includes one of an organic material, an inorganic material, and a composite material. The preceding subject matter of this paragraph characterizes example 16 of the present disclosure, wherein example 16 also includes the subject matter according to any one of examples 10-15, above.

The parylene sub-layer includes one of parylene C, parylene F, parylene N, parylene A, or parylene D. The second parylene sub-layer includes one of parylene C, parylene F, parylene N, parylene A, or parylene D. The at least one ALD sub-layer includes one of an organic material, an inorganic material, and a composite material. The second ALD sub-layer includes one of an organic material, an inorganic material, and a composite material. The preceding subject matter of this paragraph characterizes example 17 of the present disclosure, wherein example 17 also includes the subject matter according to any one of examples 10-16, above.

The method for depositing multiple layers onto a substrate includes automatically moving the substrate through a gate valve between a parylene deposition chamber and an ALD deposition chamber. The preceding subject matter of this paragraph characterizes example 18 of the present disclosure, wherein example 18 also includes the subject matter according to any one of examples 10-17, above.

The method for depositing multiple layers onto a substrate includes sealing a parylene deposition chamber with a gate valve. The preceding subject matter of this paragraph characterizes example 19 of the present disclosure, wherein example 19 also includes the subject matter according to any one of examples 10-18, above.

Disclosed herein is a modular multilayer deposition system. The modular multilayer deposition system includes a plurality of modular deposition chambers, including at least one parylene deposition chamber and a second deposition chamber. The parylene deposition chamber is connected in series with the second deposition chamber. The system further includes a controller configured to control the at least one parylene deposition chamber and the second deposition chamber. The preceding subject matter of this paragraph characterizes example 20 of the present disclosure.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Figure 1:
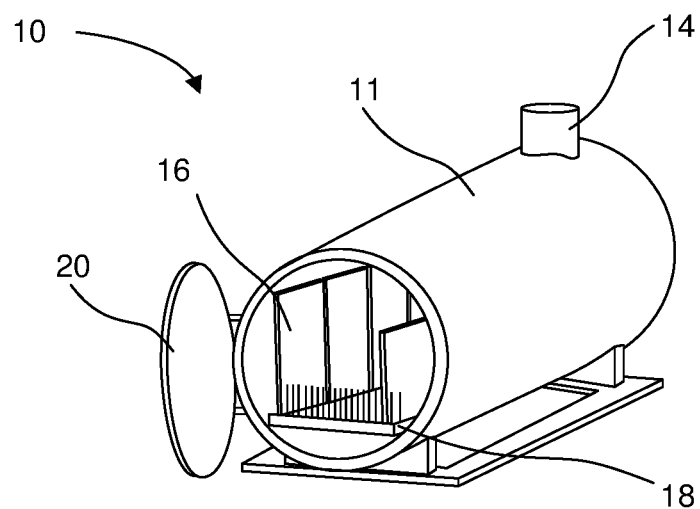
FIG. 1 is a modular deposition apparatus, according to one or more embodiments of the present disclosure.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings.

Depositing a parylene coating includes inserting a plurality of substrates (e.g., devices or components) into a deposition chamber, processing parylene precursor materials (e.g., dimer) in a vaporizer and pyrolizer, and then applying processed parylene materials to the substrates. A substrate may include any of an electrical device, an industrial device, a vehicular device, a precision mechanical device, a medical device, a scientific instrument, an article of clothing or the like, or a subcomponent of the like. Such a deposition process may be time intensive, for example, in certain implementations. The substrates may need to be kept in a deposition chamber for hours. However, extensive processing times may disrupt lean manufacturing objectives. In many industries, subcomponents (e.g., substrates) of electronic devices are in need of protective coatings before being assembled into finished products. The coating is deposited during the production process. In one example, the subcomponents are removed from a production assembly line and processed through protective coating deposition chambers. The time intensive deposition process may result in production down times and delays while waiting for large batches of substrates to be coated.

One possible solution to reducing production down times is to increase the size of the batch of substrates being coated. Increasing the number of substrates being processed typically requires a larger deposition chamber to house a greater number of substrates. However, larger chambers may result in processing challenges. For example, because the deposition materials enter the deposition chamber at an inlet on a side of the deposition chamber, in many cases, the substrates located near the inlet are exposed to higher concentrations of deposition materials than substrates located at a position in the deposition chamber opposite the inlet. Accordingly, in large chambers, the thickness of deposited coatings on the substrates may vary greatly, depending on the location of the substrate within the deposition chamber. In addition, particular pressure and temperature parameters for depositing coatings may vary to a greater degree within larger chambers which may cause non-uniformity in the coatings depending on the particular location of the substrate within the deposition chamber.

In contrast, smaller deposition chambers may generally improve the film quality (e.g., uniformity) of protective coatings and the cycle time of the deposition process. Smaller modular deposition chambers allow manufacturers to design a particular number and configuration of deposition chamber to accurately achieve production targets without sacrificing film quality.

In one aspect, this disclosure relates to a system of serially connected modular deposition chambers for the deposition of protective coatings on substrates. A protective coating according to this disclosure can be a multi-layer protective coating. The modular deposition chambers according to this disclosure may deposit a multi-layer protective coating, including a combination of at least one atomic layer deposition ("ALD") layer and at least one parylene layer. The modular deposition chambers may include parylene deposition chambers and/or ALD reaction chambers. The modular deposition chambers may apply, onto the substrates, a variety of materials including but not limited to parylenes (e.g., parylene F, parylene C, parylene N, parylene D, etc.), organic materials, inorganic materials, composite materials, etc.

In some embodiments, the modular deposition chambers are serially connected and include at least one parylene deposition chamber and at least one ALD chamber. The modular deposition chambers allow for customizable sequencing of the deposition chambers to achieve a particular multi-layer coating and provide a particular form of protection to substrates and electronic devices. In one example, a system includes multiple deposition chambers serially connected in a sequence of one parylene deposition chamber, four ALD reaction chambers, an additional parylene deposition chamber, and an additional four ALD reaction chambers. In such an example, the deposited multi-layer coating includes a parylene sub-layer, an ALD sub-layer, a second parylene sub-layer, and a second ALD sub-layer. However, any of a variety of multi-layer coatings may be achieved by configuring the sequence of modular deposition chambers in a desired manner.

In another aspect, this disclosure relates to a system that includes a plurality of parylene deposition chambers connected in series to one or more pyrolizers.

The protective coatings applied to surfaces of the electronic devices may impart moisture resistance to the electronic devices. As used herein, the terms "moisture-resistant" and "moisture-resistance" refer to the ability of a coating to prevent exposure of a coated element or feature to moisture. As an example, a moisture-resistant coating may resist wetting or penetration by one or more types of moisture, or it may be impermeable to one or more types of moisture or substantially impermeable to one or more types of moisture. The term "substantially impermeable" indicates that over long durations of time, some moisture may migrate through the coating. Long durations of time may refer to periods of 5 years, 10 years, 15 years, or 20 years. When subjected to temperatures below 100° C., a long duration of time may refer to 20 years. "Moisture-resistant" may be defined, in some cases, as having a water vapor transmission less than 0.25 g-mil/100 in$^2$-day (at 38° C. and 90% relative humidity). Both moisture-impermeable and substantially moisture-impermeable barriers are, for the sake of simplicity, referred to herein as "moisture impermeable" barriers.

In some embodiments, a moisture-resistant coating may be impermeable to, substantially impermeable to, and/or repel water, an aqueous solution (e.g., salt solutions, acidic solutions, basic solutions, drinks, etc.) or vapors of water or other aqueous materials (e.g., humidity, fogs, mists, wetness, etc.). The terms "moisture-resistant" and "moisture-resistance" may also refer to the ability of a coating to restrict permeation of or repel organic liquids or vapors (e.g., organic solvents, other organic materials in liquid or vapor form, etc.), as well as a variety of other substances, corrosive materials, or conditions that might damage a substrate (e.g., a moisture-sensitive substrate, etc.), such as an electronic device or its components.

In one aspect, this disclosure relates to multi-layer protective coatings. In some embodiments, the multi-layer protective coating includes at least one parylene sub-layer and at least one ALD sub-layer. In some embodiments, the multi-layer protective coating includes more than one parylene sub-layer and more than one ALD sub-layer. In some embodiments, the multi-layer protective coating includes at least one parylene sub-layer between two or more ALD sub-layers.

Methods for forming a multi-layer protective coating are also disclosed herein. Such methods may include applying a parylene sub-layer to substrates within a parylene deposition chamber, applying at least one ALD sub-layer to the substrates over and/or under the parylene sub-layer within an ALD deposition chamber, applying a second parylene sub-layer to the substrates over the at least one ALD sub-layer within a second parylene deposition chamber, and applying a second ALD layer to the substrates over the second parylene sub-layer within a second ALD deposition chamber. In some embodiments, the parylene sub-layer includes one of parylene C, parylene F, parylene N, and parylene D. In one embodiment, the at least one ALD sub-layer includes one of an organic material, an inorganic material, and a composite material.

Embodiments of moisture-resistant protection, as described herein, may be particularly useful for protecting state of the art mobile electronic devices from accidental or incidental exposure to moisture. One sub-layer may provide the primary type of moisture-resistance (e.g., a moisture-impermeable coating or barrier that covers and seals, or substantially seals, at least some moisture-sensitive components or other features within the interior of an electronic device in a manner that will prevent moisture from contacting those components or other features, should moisture enter into the interior of the electronic device).

A secondary type of moisture resistance may be provided by a second sub-layer. The secondary type of moisture resistance may not provide the same degree of resistance to moisture as the primary type of moisture resistance. For example, a parylene sub-layer may provide the primary type of moisture resistance and an ALD layer may provide the secondary type of moisture resistance.

Some embodiments of the multi-layer coating may be configured to enable electrons to move through the multi-layer coating. For example, the multi-layer coating may be electrically conductive or it may be too thin to prevent electricity from passing there through. In other embodiments, the thickness (or thinness) of the multi-layer coating may enable ready removal of the coating from electrically conductive features (e.g., communication ports, contacts, etc.) to expose the same and, thus, to facilitate electrical connections to the exposed electrically conductive features.

Other aspects, as well as features and advantages of various aspects, of the disclosed subject matter will be apparent to those of ordinary skill in the art through consideration of this disclosure and the appended claims.

FIG. 1 depicts an embodiment of a modular deposition apparatus 10. The illustrated embodiment includes a deposition chamber 11. The deposition chamber 11 includes an inlet 14. The inlet 14 is configured to receive a processed material (or precursor) to be applied to one or more substrates 16 housed within the deposition chamber 11. In some embodiments, the apparatus further includes tray 18 holding a plurality of substrates 16, housed within the deposition chamber 11. A substrate 16 may include any of an electrical device, an industrial device, a vehicular device, a precision mechanical device, a medical device, a scientific instrument, an article of clothing or the like, or a subcomponent of the like. The deposition chamber 11 may include a hatch 20 or lid that is selectively openable and closable to respectively allow access to and seal the deposition chamber 11.

The deposition chamber 11 may be a parylene deposition chamber or an ALD deposition chamber. A parylene deposition chamber is configured to deposit a parylene layer or sub-layer and is described in conjunction with FIG. 2. An ALD deposition chamber is configured to deposit an ALD layer or sub-layer. In an ALD process, the substrate 16 is introduced into the deposition (or reaction) chamber 12 of ALD equipment. Precursor materials may be introduced into the deposition chamber, and conditions may be created within the deposition chamber that will enable the precursor materials or reactive species formed from the precursor materials to adsorb to a surface of the substrate and to react on the surface of the substrate 16. The reaction may be carried out at temperatures that will not damage the substrate 16. In some embodiments, the reaction may occur at a low temperature (e.g., a temperature of about 150° C. and below, about 100° C. and below, about 75° C. and below, about 50° C. and below and room temperature (e.g., about 25° C., about 23° C. to about 27° C., etc.). A thickness of the layer or film of material that is formed on the substrate 16, which may include a sub-layer of a multi-layer protective coating, may be about the same as a distance across one atom forming the material or as a distance across one molecule of the material. In some embodiments, the thickness of one sub-layer of the film is one to three angstroms (Å) for an atomic layer and three to six angstroms (Å) for a molecular layer. The ALD process may be repeated any number of times until a protective coating with desired characteristics, such as a desired number of sub-layers with different sub-layers including a desired sequence of different materials. The sub-layers may have different properties (e.g., porosities, densities, etc.) from one another, etc. The ALD process may be repeated in serially connected ALD deposition chambers.

An ALD process according to this disclosure may also include the application of energy to a multi-layer protective coating or one or more sub-layers of the multi-layer protective coating. In some embodiments, energy may also be applied to a material that is used to form a sub-layer of the protective coating and/or to a substrate 16 upon which a protective coating is being formed. Besides thermal energy, the energy may include electromagnetic radiation. In some embodiments, the electromagnetic radiation may include ultraviolet (UV) radiation (e.g., radiation having a wavelength of about one hundred nanometers to about three hundred and ten nanometers, radiation having a wavelength of about one hundred nanometers to about two hundred and fifty nanometers, radiation having a wavelength of about one hundred nanometers to about two hundred nanometers, and/or radiation having a wavelength of about one hundred nanometers to about one hundred and fifty nanometers, etc.), which may be applied to all or part of a protective coating. In other embodiments, energy may be applied in the form of infrared (IR) radiation. Other examples of the types of energy that may be applied to a multi-layer protective coating include plasma and ultrasonic energy.

UV, IR, and other wavelengths (or bandwidths) of electromagnetic radiation, as well as other types of energy, may facilitate the removal of contaminants (e.g., byproducts of reactions within the deposition chamber 11, such as carbon dioxide ($CO_2$), water ($H_2O$), unreacted reactants, contaminants, etc.) from an ALD layer or film. By removing contaminants, the incidence of defects in a coating may be reduced. For example, removal of contaminants during a reaction may prevent the formation of pores or other defects in a layer as the layer is formed. Alternatively, removal of contaminants following the deposition of a layer may minimize the sizes of defects that are present in layers that have already been formed, reverse at least some defects, and/or prevent the formation of pores or other defects in one or more subsequently formed layers. Thus, applying energy to all or part(s) of a protective coating, to one or more sub-layers of a protective coating, to the reactants that are used to form the protective coating, and/or to the substrate on which the protective coating is formed may enable the use of low temperature processes while providing a coating with properties that are comparable to similar films or laminates formed by conventional high temperature processes.

In some embodiments, energy may be applied during the deposition of each layer or sub-layer of a multi-layer protective coating. In other embodiments, energy may be applied to each layer or sub-layer of a multi-layer protective coating just after the layer or sub-layer has been formed. Alternatively, energy may be applied after a predetermined number of sub-layers have been formed by ALD processes. As another alternative, energy may be applied after a specific type of material has been deposited or a material having a specific property (e.g., porosity, density, etc.) has been deposited, and before a different material or the same material with a different specific property is deposited. Optionally, a protective coating may be exposed to energy after deposition of the protective coating has been completed.

Figure 2:
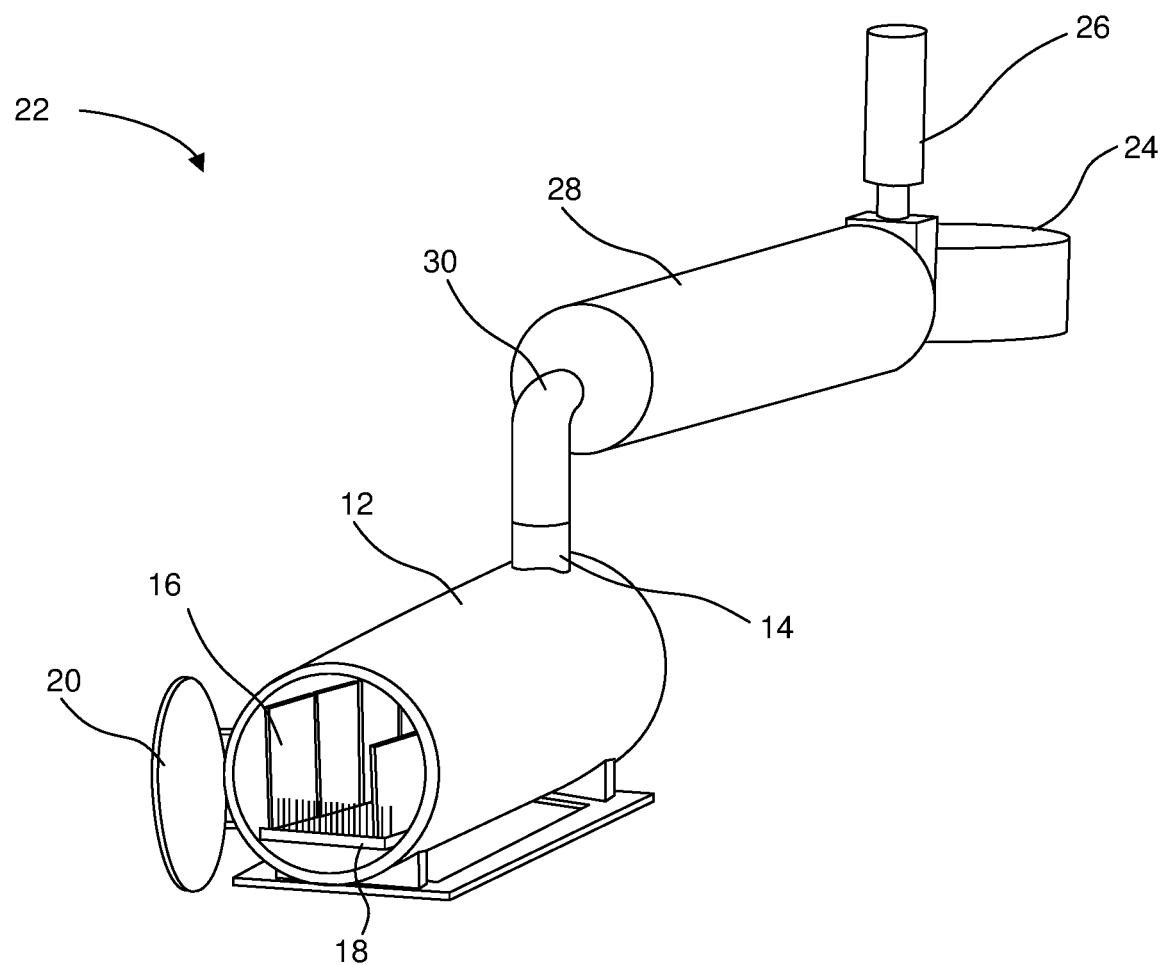
FIG. 2 is a parylene deposition system, according to one or more embodiments of the present disclosure.

FIG. 2 depicts an embodiment of a parylene deposition system 22, including a vaporizer 24 for vaporizing precursor material (e.g., dimer), a valve 26, a pyrolizer 28, and a parylene deposition chamber 12, for housing the substrates 16. The system 22 further includes a hatch 20 or lid on the parylene deposition chamber 12. The hatch 20 or lid may be selectively openable and closable to respectively allow access to and seal the deposition chamber 12. A parylene deposition system 22 may include fewer or more features than shown that perform fewer or more functions as described herein.

In one embodiment, the parylene deposition system 22 includes means for maintaining a pressure (e.g., a negative pressure, or vacuum, etc.) within the parylene deposition system 22. One or more of the chambers may communicate with a vacuum pump and other elements that may facilitate the deposition of parylene material onto the substrates 16. One or more valves may also control the flow of the parylene materials through the parylene deposition system 22 and onto the substrates 16. The illustrated embodiment includes a conduit 30 between the pyrolizer 28 and the inlet 14 of the deposition chamber 12. In some embodiments, the conduit 30 includes a valve to regulate the flow of material from the pyrolizer 28 to the deposition chamber 12.

The vaporizer 24 may vaporize one or more types of parylene precursors for the formation of parylene materials such as parylene C (poly(chloro-p-xylylene)), parylene F (which can specifically refer to parylene-VT4, parylene-AF4, or any other parylene with a fluorine atom or atoms in the molecular structure), parylene N (poly(p-xylylene)), parylene D (poly(dichloro-p-xylylene)), parylene A (amino-modified parylene), etc.

The deposition chamber 12 may be a modular deposition chamber and may include an opening through which the substrates can proceed from one deposition chamber to another deposition chamber after the opening of, for example, a hatch 20.

Figure 3:
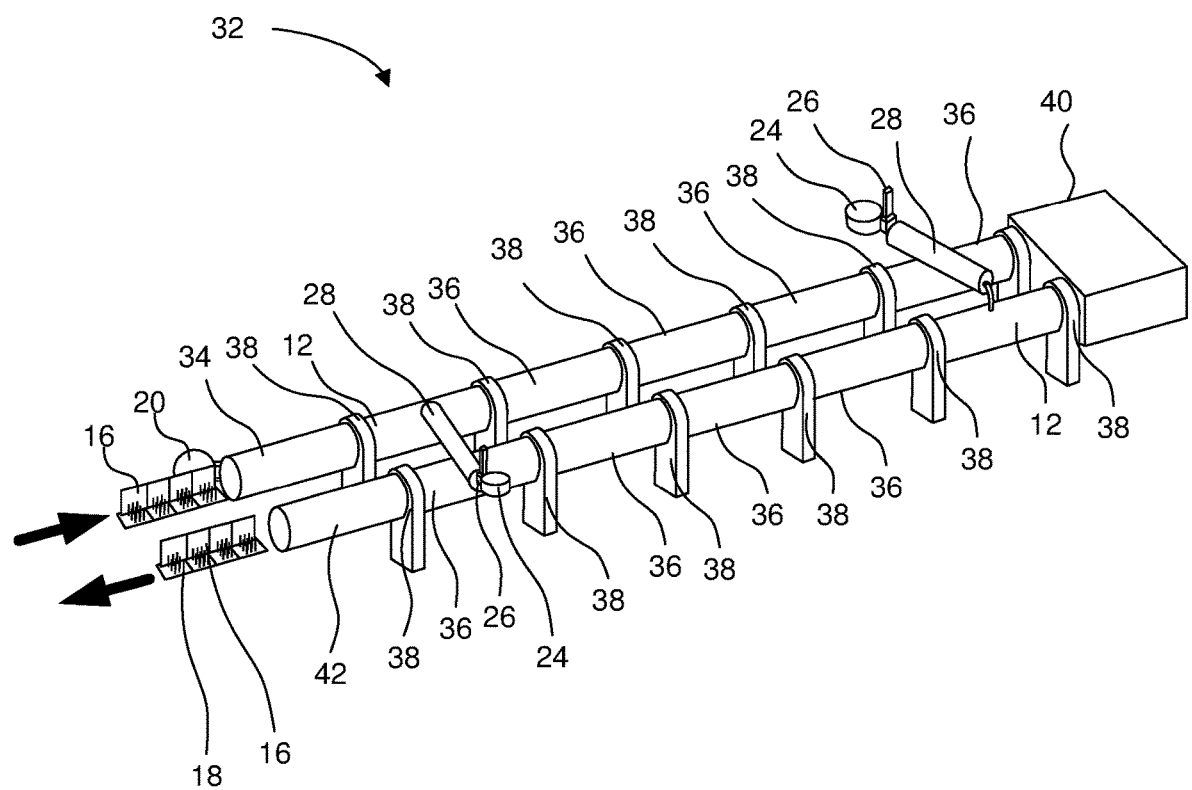
FIG. 3 is a modular, multilayer, deposition system, according to one or more embodiments of the present disclosure.

Referring to FIG. 3, a modular, multilayer, deposition system 32 is depicted with a plurality of deposition chambers (including a plurality of parylene deposition chambers 12 and a plurality of ALD deposition chambers 36. The modular deposition chambers are serially connected to each other to achieve a particular multi-layer coating. The modular multilayer deposition system 32 of FIG. 3 includes a loading chamber 34 into which a plurality of substrates 16 may be inserted. The substrates 16 will proceed consecutively through each parylene deposition chamber 12 and each ALD deposition chamber 36. The deposition chambers 12, 36 are connected to each other with a gate valve 38 that movably separates the deposition chambers 12, 36 during the deposition process. The gate valve 38 (or hatch 20) may be configured to open and allow the substrates 16 to proceed to the next deposition chamber and/or close to seal the deposition chambers 12, 36 during a deposition process. In some embodiments, the process is automated to allow for the substrates to proceed automatically after the deposition process of a particular chamber is complete. The interconnectivity between the modular deposition chambers 12, 36 facilitated by the connections allow for any configuration (e.g., quantity, order, etc.) of deposition chambers 12, 36 to be assembled.

In the illustrated embodiment, a first parylene deposition chamber 12 is serially connected to the loading chamber 34. The first parylene deposition chamber 12 includes an inlet 14 through which parylene material may enter after processing through a pyrolizer 28. Four ALD deposition chambers 36 are serially connected after the first parylene deposition chamber 12. The illustrated embodiment includes a transfer chamber 40 that may house the substrates before proceeding through the remaining deposition chambers 12, 36. The illustrated embodiment includes a second parylene deposition chamber 12 and a second set of four serially connected ALD deposition chambers 36 with gate valves 38 between each of the deposition chambers 12, 36. The illustrated embodiment further includes an unloading chamber 42. In the illustrated embodiment, the modular deposition chambers 12, 36 allow for customization depending on the protection needs of the substrates 16. In addition, the smaller modular deposition chambers 12, 36 allow for a steady stream of substrates 16 exiting the unloading chamber 42. When the substrates 16 proceed through the modular multilayer deposition system 32 as one part of an overall production assembly line, the smaller batches allow for lean manufacturing processes and less interruption of the overall production assembly line.

The four consecutive ALD chambers 36 may, in some embodiments, deposit different materials onto the substrates 16. In some embodiments, the four consecutive ALD chambers 36 may deposit a single material onto the substrates. The four consecutive ALD chambers 36 may allow the system 32 to move the substrates 16 from deposition chamber 12, 36 to deposition chamber 12, 36. If, for example, the ALD processing time is four times greater than the parylene processing time, the ALD process may be divided into the four consecutive ALD chambers 36. In such an example, the substrates 16 may proceed from deposition chamber 12, 36 to deposition chamber 12, 36 without waiting for a longer deposition time in a one particular deposition chamber 12, 36.

In some embodiments, the substrates 16 are automatically moved from one deposition chamber 12, 36 to the next deposition chamber 12, 36. In some embodiments, the system 32 may include components for achieving automatic movement of the substrates 16 from deposition chamber 12, 36 to deposition chamber 12, 36. In one embodiment, components may move the tray 18 from deposition chamber 12, 36 to deposition chamber 12, 36. In one embodiment, components may move a liner from deposition chamber 12, 36 to deposition chamber 12, 36. For example, such components may include conveyor belt to move trays 18 holding the substrates 16 from one deposition chamber 12, 36 to the next deposition chamber 12, 36. In another example, the components may include rollers. In addition, the gate valve 38 or hatch 20 may be configured to automatically open to allow movement of the substrates 16 and close to seal the deposition chambers 12, 36 during the deposition process.

As the deposition chambers 12, 36 are modular, the order of the deposition chambers 12, 36 can be changed to vary the resultant coating deposited on the substrates. The order of deposition chambers 12, 36 may be adjusted depending on the needs of the particular substrates. For example, the order may start with a parylene deposition chamber 12, followed by an ALD deposition chamber 36. The order may then be swapped to start with an ALD deposition chamber 36, followed by a parylene deposition chamber 12. The modular deposition chambers allow for adjustment of the sequence deposition.

Figure 4:
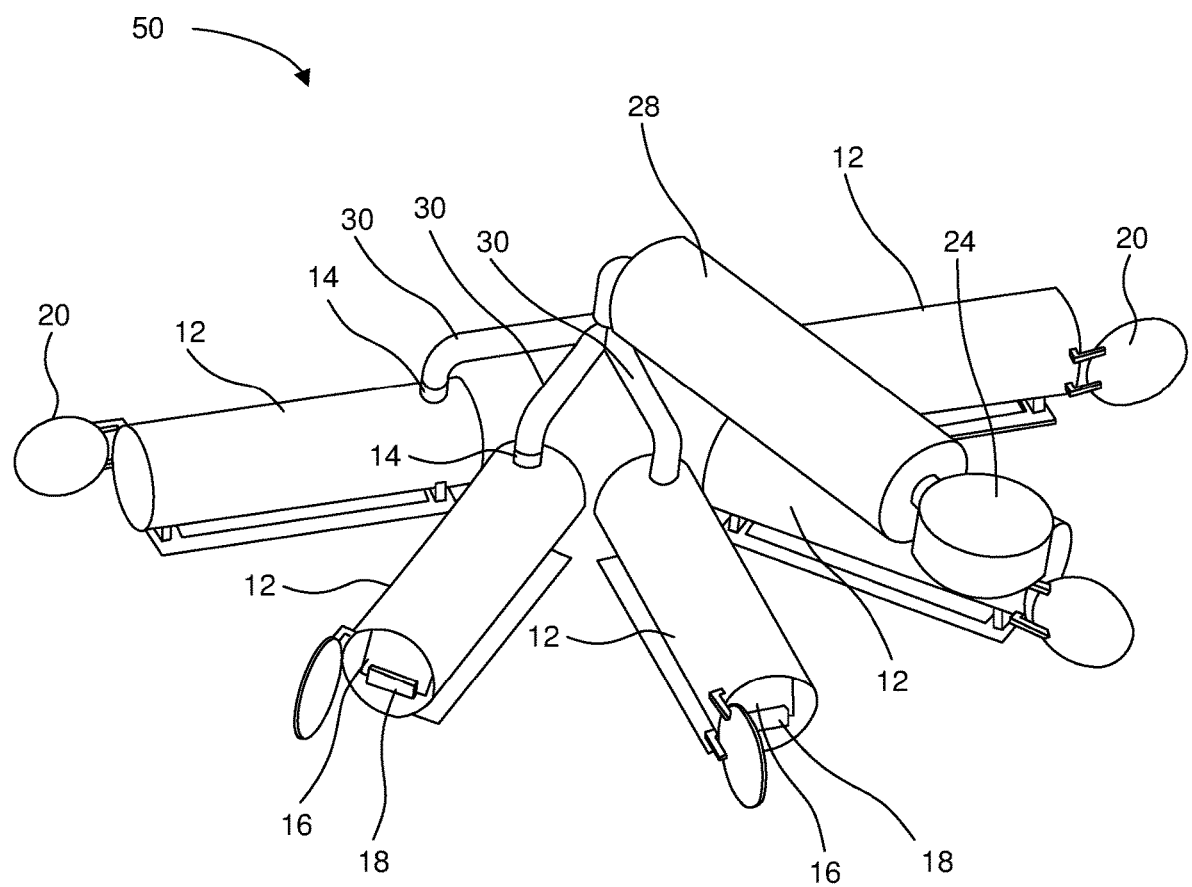
FIG. 4 is a parylene deposition system, according to one or more embodiments of the present disclosure.

Referring to FIG. 4, an embodiment of a parylene deposition system 50 is depicted. The illustrated embodiment includes a vaporizer 24, a pyrolizer 28, and a plurality of parylene deposition chambers 12. The plurality of parylene deposition chambers 12 are connected in parallel to the pyrolizer 28 through respective conduits 30. Each conduit 30 connects to the inlet 14 of a respective one of the five parylene deposition chambers 12. The illustrated embodiment includes five modular parylene deposition chambers 12. However, any number of modular parylene deposition chambers 12 may be used depending on the needs of a user. For larger production needs, more modular parylene deposition chambers 12 may be used. For smaller production needs, fewer modular parylene deposition chambers 12 may be used. Each respective conduit 30 may include a valve which may be used to regulate, direct, or control material flow into a respective modular parylene deposition chamber 12.

The parylene deposition system 50 may be utilized in conjunction with the modular, multilayer, deposition system 32 described with reference to FIG. 3. That is, the parallel deposition chambers 12 of the parylene deposition system 50 may each be connected in series to ALD deposition chambers 36 as generally described with regard to FIG. 3. Such integration would allow for higher outputs of multilayer coatings.

Figures 5, 6:
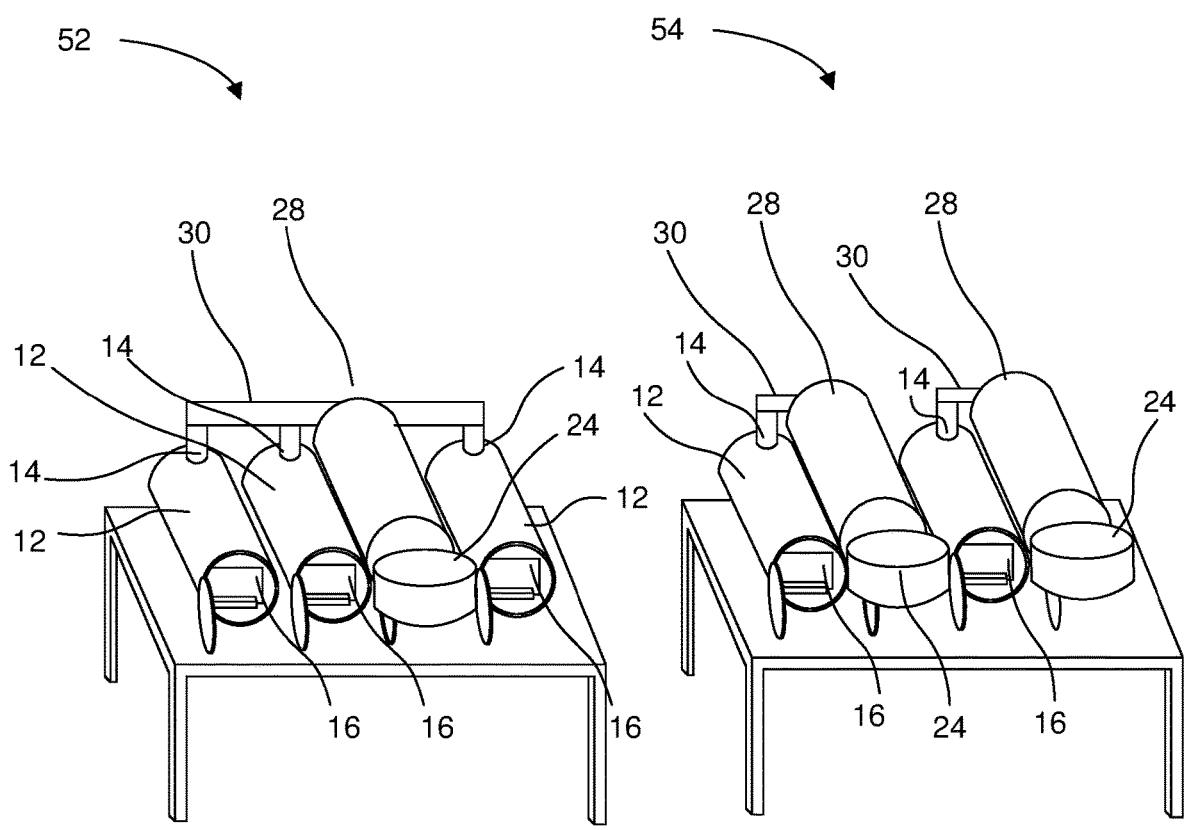
FIG. 5 is a parylene deposition system, according to one or more embodiments of the present disclosure.
FIG. 6 is a parylene deposition system, according to one or more embodiments of the present disclosure.

Referring to FIG. 5, embodiments of parylene deposition system 52 is depicted. The illustrated embodiment depicts a system 52 with four modular parylene deposition chambers 12 connected in parallel to a single pyrolizer 28. Any of a number of configurations may be achieved with the modular parylene deposition chambers 12. The conduit 30 allows for a single pyrolizer 28 to be connected or coupled to four modular parylene deposition chambers 12. The conduit 30 may include valves to allow for less than all the modular parylene deposition chambers 12 to be used during any particular deposition process. For example, if only three of the four modular parylene deposition chambers 12 include substrates to be coated, a valve may direct coating materials away from the empty modular parylene deposition chamber 12 and to the three modular parylene deposition chambers 12 with substrates.

Referring to FIG. 6, embodiments of parylene deposition system 54 is depicted. The illustrated embodiment depicts a system 54 including two modular parylene deposition chambers 12 connected in parallel to a single pyrolizer 28. Any of a number of configurations may be achieved with the modular parylene deposition chambers 12. Each conduit 30 allows for a single pyrolizer 28 to be connected or coupled to two modular parylene deposition chambers 12. The conduit 30 may include valves to allow for less than all the modular parylene deposition chambers 12 to be used during any particular deposition process. For example, if only one of the two modular parylene deposition chambers 12 include substrates to be coated, a valve may direct coating materials away from the empty modular parylene deposition chamber 12 and to the modular parylene deposition chamber 12 with substrates.

Figure 7:
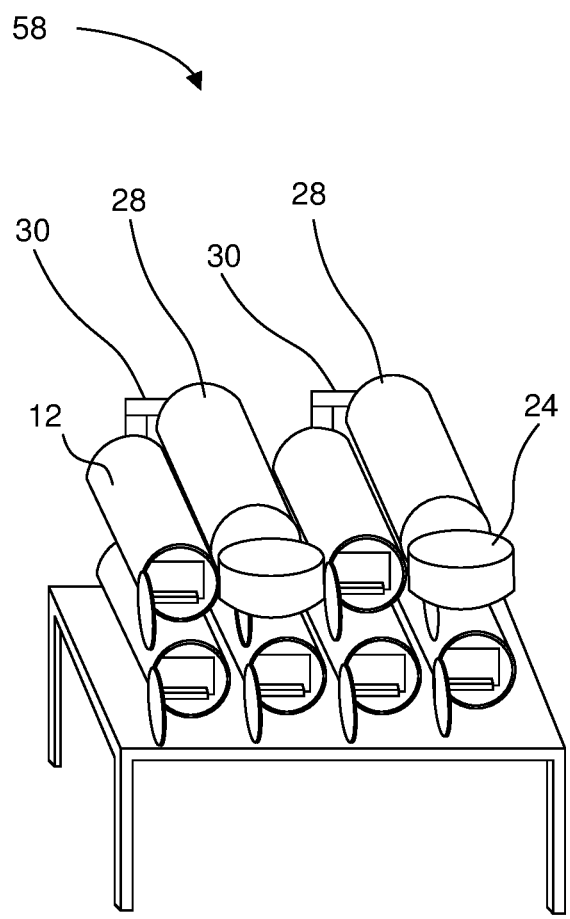
FIG. 7 is a parylene deposition system, according to one or more embodiments of the present disclosure.

Referring to FIG. 7, a modular parylene deposition systems 58 is depicted. System 58 includes a first set of four modular parylene deposition chambers 12 connected in parallel to a single pyrolizer 28, and a second set of four modular parylene deposition chambers 12 connected in parallel to a single pyrolizer 28. The particular configuration of FIG. 7 allows for four modular parylene deposition chambers 12 connected in parallel to a single pyrolizer 28 while maintaining a smaller footprint than what is depicted in FIG. 5.

Figure 8:
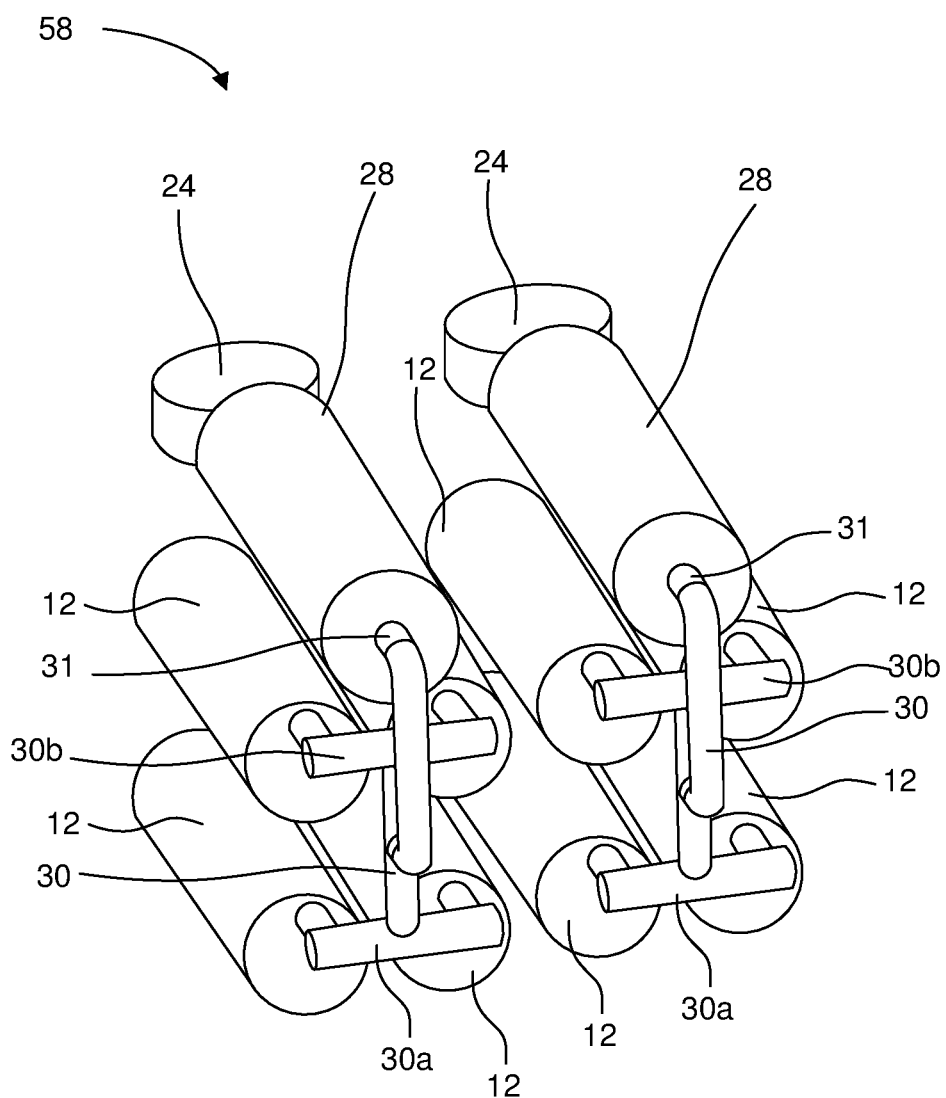
FIG. 8 is a parylene deposition system, according to one or more embodiments of the present disclosure.

A rear view of system 58 is depicted in FIG. 8. As depicted, the modular parylene deposition chambers 12 are stacked vertically. The configuration of multiple modular parylene deposition chambers 12 may lower the "footprint" or overall square footage of a parylene deposition apparatus. By stacking the modular parylene deposition chambers 12, a manufacturing facility can increase the production of coated substrates without increasing the area needed to perform the process.

In the illustrated embodiment, the pyrolizer 28 includes an outlet 31 which bifurcates into a lower conduit 30a and an upper conduit 30b. The upper conduit 30b and the lower conduit 30a are further bifurcated into two pathways, ultimately leading to four modular deposition chambers 12. At each bifurcation or at other points in the conduit, valves may be located which can be utilized to direct coating materials into the particular deposition chambers 12 that a user indicates.

Figure 9:
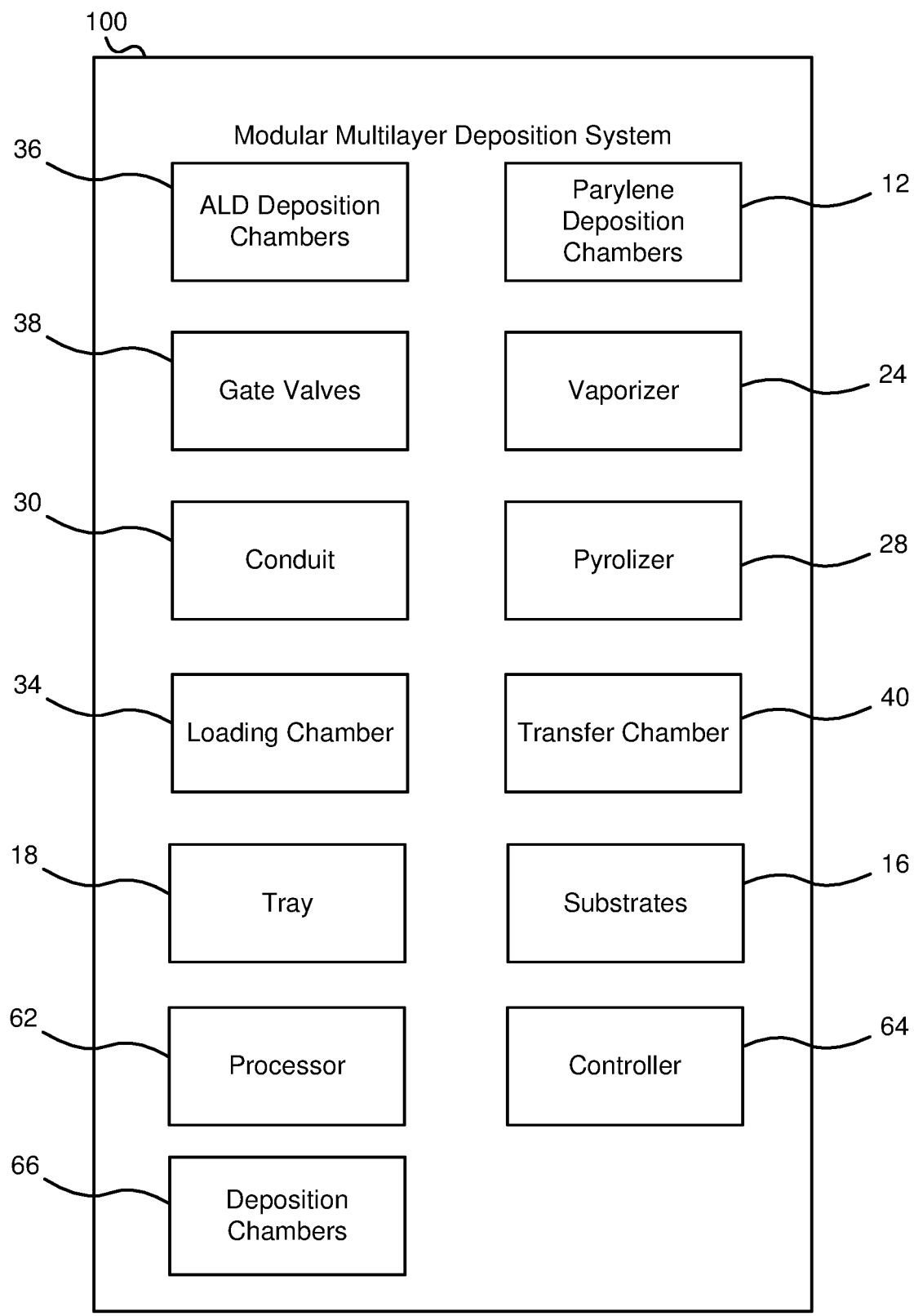
FIG. 9 is a schematic diagram of a processing system, according to one or more embodiments of the present disclosure.

Referring to FIG. 9, a schematic block diagram of a modular, multilayer, deposition system 100 is shown. The modular, multilayer, deposition system 100 includes ALD deposition chambers 36 and parylene deposition chambers 12. The modular, multilayer, deposition system 100 may incorporate different configurations and sequences of ALD deposition chambers 36 and parylene deposition chambers 12. As the ALD deposition chambers 36 and parylene deposition chambers 12 are modular and configured to interconnect, a particular manufacturing site may interconnect the ALD deposition chambers 36 and parylene deposition chambers 12 in the sequence desired for the particular needs of their application. The modular nature of the chambers 12, 36 allow for flexibility to meet the needs a disparate end users.

The modular, multilayer, deposition system 100 may further include various gate valves 38 which are configured to interconnect the modular deposition chambers 12, 36. The gate valves 38 allow for isolation of the modular deposition chambers 12, 36 from each other during processing by separating and sealing the modular deposition chambers 12, 36. The modular, multilayer, deposition system 100 may further include vaporizers 24, pyrolizers 28, and conduits 30 which allow for various configurations of parylene deposition chambers 12 in parallel and series.

The modular, multilayer, deposition system 100 may further include loading chambers 34, transfer chambers 40, and unloading chambers 42 which facilitate smoother transition into, out, and throughout the modular, multilayer, deposition system 100. A user may load substrates 16 onto a tray 18 which is then loaded into the loading chamber 34. The tray 18 and substrates 16 are then processed through the modular, multilayer, deposition system 100 to the various modular deposition chambers 12, 36 automatically. A seamless process results in a deposited multi-layer coating including ALD sub-layers and parylene sub-layers.

The modular, multilayer, deposition system 100 may further include deposition chambers 66. While described herein with reference to ALD deposition chambers 36 and parylene deposition chambers 12, some embodiments utilize deposition chambers that are not limited to ALD and/or parylene deposition chambers but may utilize other deposition materials and other processes.

The modular, multilayer, deposition system 100 may further include computing components including a processor 62, memory, and a controller 64, to allow for control of the various components of the system. The processor 62 and the controller 64 may be coupled to the components of the modular, multilayer, deposition system 100. While described in conjunction with the modular, multilayer, deposition system 100 of FIG. 9, the processor 62 and controller 64 may be included with respect to the remaining figures and embodiments described herein.

The processor 62 (which may be referred to as a central processor unit or CPU) may be coupled to the controller 64 and the processor 62 and the controller 64 may be coupled to and in communication with the other components of the modular, multilayer, deposition system 100 including, but not limited to, the gate valves 38, deposition chambers 66, parylene deposition chambers 12, ALD deposition chambers 36, vaporizers 24, pyrolizers 28, etc.

The controller 64 may be configured to control the various components of the modular, multilayer, deposition system 100 and the various deposition processes. A controller 64 may, in some embodiments, be configured to control each of the deposition chambers within the system 100 to allow for the processing to occur in multiple deposition chambers. The controller 64 may further be configured to control the movement of the substrates 16 and tray 18 throughout the system allowing for a single operator to manage and control the processing and deposition throughout the entirety of the system 100.

Once deposited onto the substrate 16, the multi-layer coating may have any of various thicknesses, including, for example, between about 0.5 microns and 25 microns. In one embodiment, a portion of the multi-layer protective coating may impart the protective coating with at least one desired characteristic (e.g., thermal conductivity, electrical insulation, UV protection, adhesion, hydrophobicity, hydrophilicity, a desired texture, a desired surface finish, etc.).

In one embodiment, the protective coating may include a material that promotes adhesion of the protective coating or a portion thereof to a substrate 16. Such an adhesion-promoting material may be selected on the basis of its ability to adhere to the structures between which the adhesion promote resides (i.e., the substrate and a base portion of the protective coating, etc.). A variety of materials may be used to enhance adhesion and/or for any of a variety of other purposes, including, without limitation, ceramic materials, such as aluminum oxide ($Al_2O_3$), which is also commonly referred to as "alumina," boron nitride, or any of a variety of other materials.

Some embodiments include capping materials that may be used as an outermost material of a protective coating, and may include aluminum oxide, diamond-like carbon (e.g., pure carbon, hydrogenated carbon, fluorinated carbon, nitrogenized carbon, phosphorylated carbon, etc., or combinations of any of the foregoing), silicon nitride, a metal oxide such as hafnium (IV) oxide ($HfO_2$), yttrium oxide ($Y_2O_3$) zirconium dioxide ($ZrO_2$), titanium dioxide ($TiO_2$), tantalum pentoxide ($Ta_2O_5$), their suboxides, or the like. As indicated herein, such a material may harden or toughen the surface of a protective coating, cover passageways through another material, or otherwise enhance the functionality, durability (e.g., hardness, impact resistance, scratch resistance, abrasion resistance, wear resistance, etc.), etc., of the protective coating.

In some embodiments, a plurality of different types of protective coatings may cover different areas of a substrate. An electronic device (e.g., a mobile electronic device, such as a smart phone, a tablet computing device, a digital media player, etc.) may include a printed circuit board that carries various components. Examples of such components include, but are not limited to, microphones, speakers, optical elements, and the like. Of course, a substrate may include any combination of protective coatings. The immediately preceding disclosure should not be considered to limit the manner in which different ratios may be combined. The protective coating(s) may be confined or substantially confined to components within the interior of an electronic device, such as within the interior of the housing or other external components of an electronic device. In other embodiments, a protective coating may cover at least some components that are exposed to the outside of the electronic device. In some embodiments, a coating method may also include the application of a mask to selected regions of the substrate to prevent at least one portion of the coating from being applied to those portions of the substrate.

Figure 10:
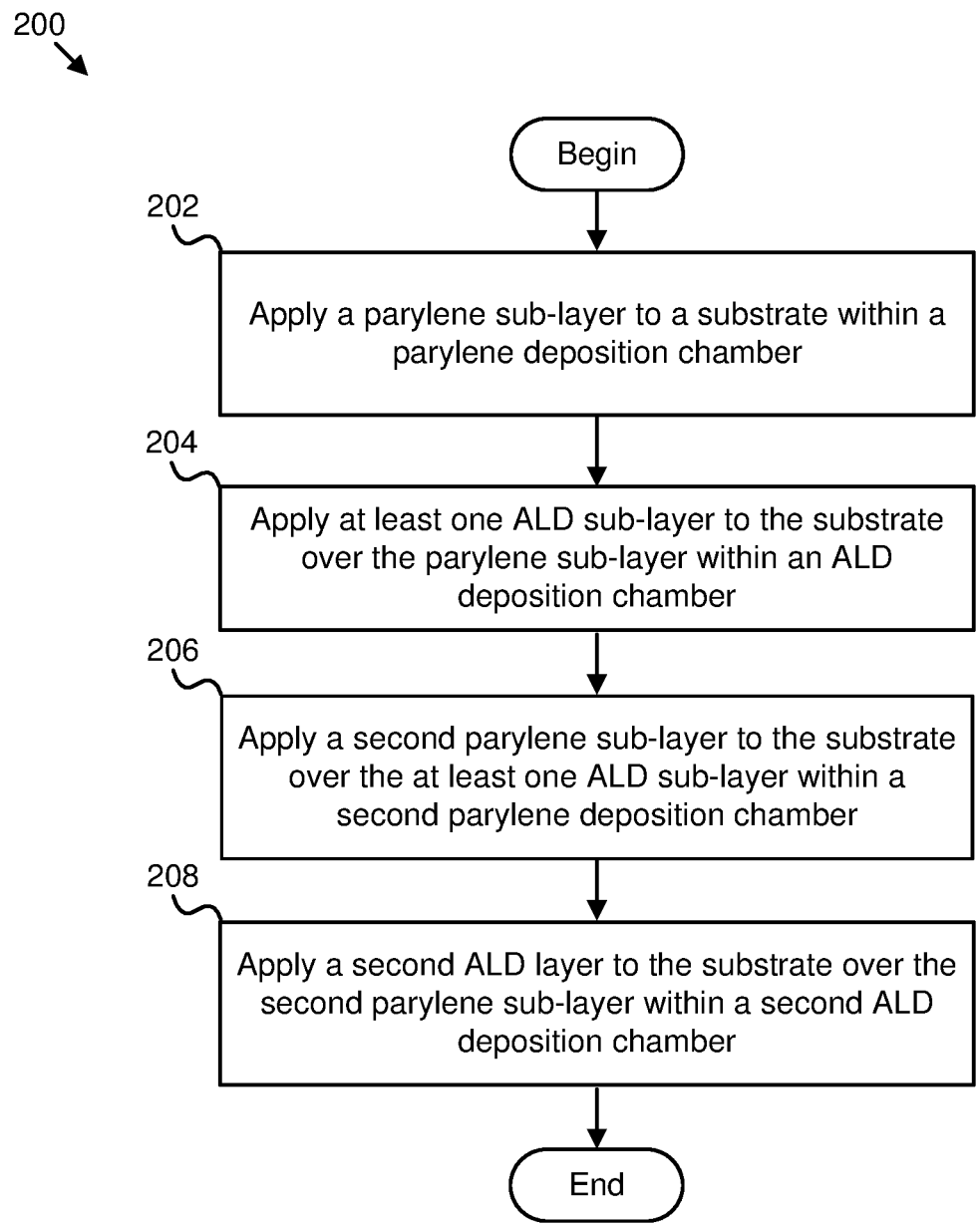
FIG. 10 is a schematic block diagram of a method for depositing multiple layers onto a substrate, according to one or more embodiments of the present disclosure.

Referring to FIG. 10, a method 200 for depositing multiple layers onto a substrate in accordance with the present invention is disclosed. At block 202, the method 200 includes applying a parylene sub-layer to a substrate within a parylene deposition chamber. At block 204, at least one ALD sub-layer is applied to the substrate over the parylene sub-layer within an ALD deposition chamber. At block 206, a second parylene sub-layer is applied to the substrate over the at least one ALD sub-layer within a second parylene deposition chamber. At block 408, a second parylene sub-layer is applied to the substrate over the at least one ALD sub-layer within a second parylene deposition chamber. The method 200 then ends.

Figure 11:
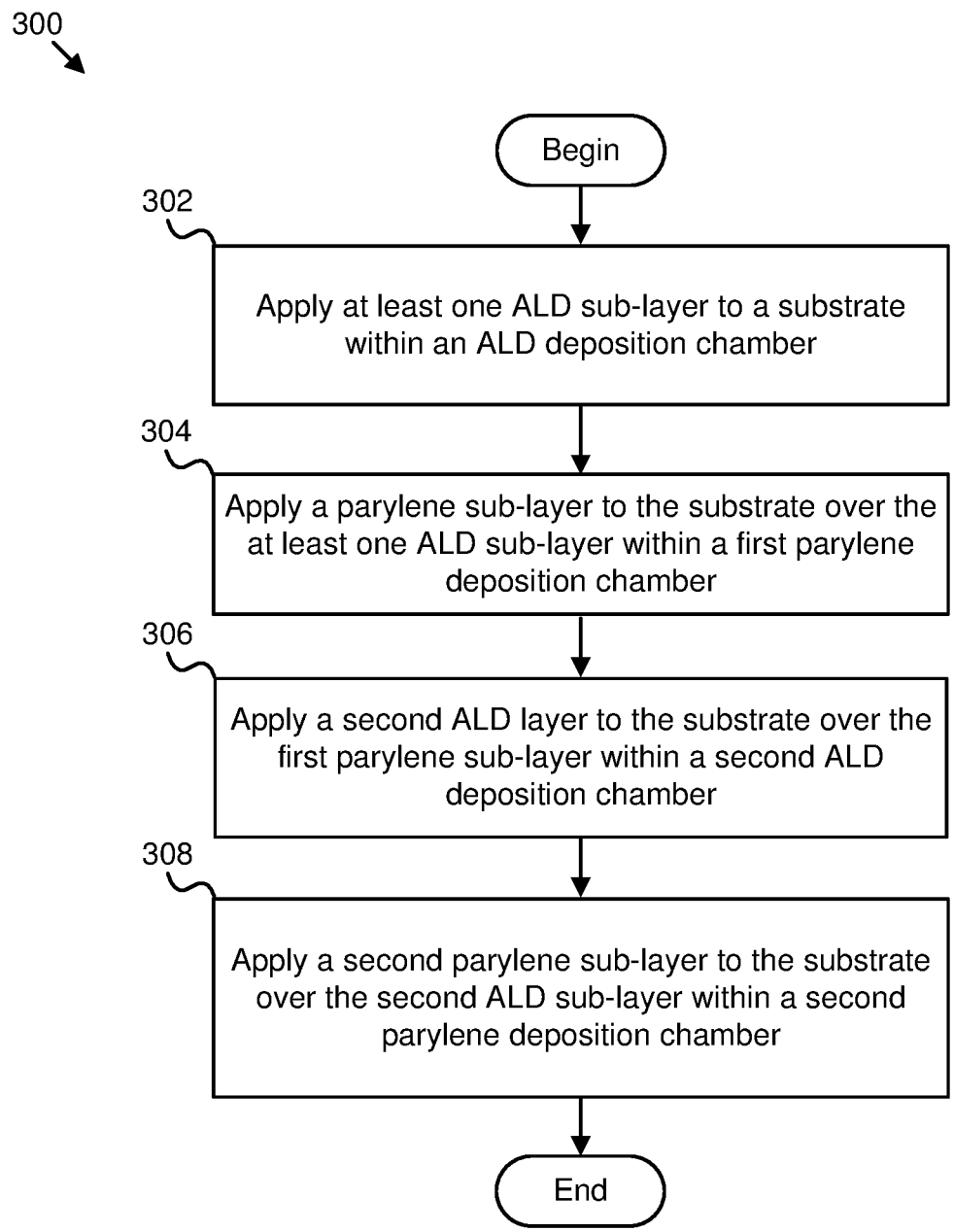
FIG. 11 is a schematic block diagram of a method for depositing multiple layers onto a substrate, according to one or more embodiments of the present disclosure.

Referring to FIG. 11, a method 300 for depositing multiple layers onto a substrate in accordance with the present invention is disclosed. At block 302, the method 300 includes applying at least one ALD sub-layer to a substrate within an ALD deposition chamber. At block 304, a parylene sub-layer is applied to the substrate over the at least one ALD sub-layer within a first parylene deposition chamber. At block 306, a second ALD layer is applied to the substrate over the first parylene sub-layer within a second ALD deposition chamber. At block 308, a second parylene sub-layer is applied to the substrate over the second ALD sub-layer within a second parylene deposition chamber. The method 300 then ends.

As is disclosed with regards to FIGS. 10 and 11 the order of sub-layers may vary. As such, in some embodiments a method for depositing multiple layers onto a substrate in accordance with the present invention includes applying a plurality of sub-layers onto a substrate, the plurality of sub-layers including a first and second ALD sub-layer and a first and second parylene sub-layer. One of the first or second ALD sub-layer is deposited between the first and second parylene sub-layer and one of the first or second parylene sub-layer is deposited between the first and second ALD sub-layer.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive.

What is claimed:

1. A modular multilayer deposition system, comprising:
   a plurality of modular deposition chambers, comprising at least one parylene deposition chamber and at least one ALD deposition chamber, wherein there is a greater number of the ALD deposition chambers than parylene deposition chamber(s);
   wherein the parylene deposition chamber is connected in series with the ALD deposition chambers, and wherein substrates are automatically moved through the series of the parylene deposition chamber and the ALD deposition chambers,
   wherein the ALD deposition chambers are in connected consecutively in series, wherein the ALD deposition chambers are configured to deposit a single layer of a material.

2. The modular multilayer deposition system of claim 1, comprising a plurality of parylene deposition chambers and a plurality of ALD deposition chambers connected in series.

3. The modular multilayer deposition system of claim 2, comprising a first parylene deposition chamber connected in series to a group of four ALD deposition chambers consecutively connected in series.

4. The modular multilayer deposition system of claim 3, further comprising a second parylene deposition chamber connected in series to a second group of four ALD deposition chambers.

5. The modular multilayer deposition system of claim 1, wherein the parylene deposition chamber is configured to deposit one of parylene C, parylene F, parylene N, parylene A, or parylene D onto the substrates within the parylene deposition chamber.

6. The modular multilayer deposition system of claim 1, further comprising a gate valve between the at least one parylene deposition chamber and the at least one ALD deposition chamber, wherein the gate valve movably separates the at least one parylene deposition chamber and the at least one ALD deposition chamber, and wherein the gate valve seals the at least one parylene deposition chamber and also the at least one ALD deposition chamber.

7. The modular multilayer deposition system of claim 1, further comprising:
   a processor; and
   a controller, the controller configured to control the at least one parylene deposition chamber and at least one ALD deposition chamber.

8. The modular multilayer deposition system of claim 7, wherein the controller is configured to control movement of the substrates between the at least one parylene deposition chamber and at least one ALD deposition chamber.

9. The modular multilayer deposition system of claim 1, further comprising:
   a pyrolizer;
   a plurality of parylene deposition chambers, wherein the plurality of parylene deposition chambers are connected in parallel to the pyrolizer; and
   a conduit between the pyrolizer and the plurality of parylene deposition chambers.

10. A modular multilayer deposition system, comprising:
    a first deposition chamber for a first type of deposition medium;
    a plurality of second deposition chambers, for a second type of deposition medium, coupled in series with the first deposition chamber, wherein the plurality of second deposition chambers are configured to deposit a single layer of a material;
    wherein each of the second deposition chambers has an individual processing time equal to the first deposition chamber, and the plurality of second deposition chambers has an aggregate processing time equal for the second type of deposition medium.

11. The modular multilayer deposition system of claim 10, further comprising a controller coupled to the first deposition chamber and the plurality of second deposition chambers, wherein the controller is configured to control movement of a tray of substrates through the first deposition chamber and the plurality of second deposition chambers to deposit a single coating layer of the first type of deposition medium and an aggregate layer of the second type of deposition medium on the substrates.

12. The modular multilayer deposition system of claim 10, further comprising a controller coupled to the first deposition chamber and the plurality of second deposition chambers, wherein the controller is configured to control movement of a liner of substrates through the first deposition chamber and the plurality of second deposition chambers to deposit a single coating layer of the first type of deposition medium and an aggregate layer of the second type of deposition medium on the substrates.

* * * * *